(12) United States Patent
Yabuuchi et al.

(10) Patent No.: US 6,184,662 B1
(45) Date of Patent: Feb. 6, 2001

(54) PULSED POWER SUPPLY DEVICE

(75) Inventors: Masataka Yabuuchi; Akihiko Iwata, both of Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/367,933

(22) PCT Filed: Dec. 25, 1997

(86) PCT No.: PCT/JP97/04849

§ 371 Date: Oct. 26, 1999

§ 102(e) Date: Oct. 26, 1999

(87) PCT Pub. No.: WO99/34502

PCT Pub. Date: Aug. 7, 1999

(51) Int. Cl.[7] ............................. G05F 1/10; H05B 37/02
(52) U.S. Cl. .................................. 323/222; 315/209 CD
(58) Field of Search ................................. 363/123, 124; 323/220, 222; 315/209 R, 209 CD, 241 R, 242, 244; 372/25, 30, 38, 82, 109

(56) References Cited

U.S. PATENT DOCUMENTS

| | | | |
|---|---|---|---|
| 4,276,497 | * 6/1981 | Burbeck et al. | 315/209 R |
| 4,745,613 | * 5/1988 | Tye et al. | 372/81 |
| 5,578,907 | * 11/1996 | Tao et al. | 315/247 |
| 5,881,082 | * 3/1999 | Yabuuchi | 372/38 |

FOREIGN PATENT DOCUMENTS

| | | |
|---|---|---|
| 3-16417 | * 1/1991 | (JP) . |
| 4-349677 | 10/1992 | (JP) . |
| 5-160485 | * 6/1993 | (JP) . |

OTHER PUBLICATIONS

The International Society for Optical Engineering Proceedings, vol. 1859, Laser Isotope Separation, Jan. 19, 1993.

* cited by examiner

*Primary Examiner*—Matthew Nguyen
(74) *Attorney, Agent, or Firm*—Sughrue, Mion, Zinn, Macpeak & Seas, PLLC

(57) ABSTRACT

A pulsed power supply device in which a capacitor (23) having a charged voltage is discharged quickly upon closure of a switch (24). First and second series circuits (51, 52) are connected to each other in series and provided between the output terminals of a DC voltage source (2). The first series circuit (51) is a series circuit of a first reactor (14) and a first forward-direction diode (15), and the second series circuit (52) is a series circuit of a second forward-direction diode (16) and a switch (24). A third series circuit (53) that is a series circuit of a capacitor (23), a second reactor (25), and a discharge tube (9) is connected in parallel to the second series circuit (52). Upon closure of the switch (24), the discharge tube emits light and, on the other hand, the capacitor (23) is discharged to produce an oscillation current, whereby a voltage develops across the capacitor (23) in the polarity opposite to the polarity at the time of the initial charging. Since this voltage is added to a power source voltage and reused in the next charging cycle, the pulsed power supply device has a high efficiency.

8 Claims, 10 Drawing Sheets

PULSED POWER SUPPLY DEVICE

TECHNICAL FIELD

The present invention relates to a pulsed power supply device that generates energy for excitation for a pulsed laser such as a copper vapor laser, an excimer laser, or a carbon dioxide laser.

BACKGROUND ART

Pulsed lasers such as a copper vapor laser, an excimer laser, and a carbon dioxide laser require a discharge tube for providing energy for excitation and a pulsed power supply device for causing the discharge tube to emit light.

To provide large laser output power, the pulsed power supply device needs to produce very large power and large power consumption occurs there. Therefore, it is desired that the pulsed power supply device be improved in operation efficiency.

FIG. 10 shows a conventional pulsed power supply device disclosed in Japanese Unexamined Patent Publication No. Hei. 4-349677, for example. In the figure, reference numeral 1 denotes an AC power source that supplies power; 2, a DC voltage source that has the AC power source 1 as an input and generates a high DC voltage; 3, a capacitor that is connected in parallel to the output of the DC voltage source 2 and stores a high voltage; 4, a switch that is connected to the capacitor 3 and releases the energy stored in the capacitor 3 through a discharge; 5, a reactor provided in series with the switch 4 in the discharge route of the capacitor 3; and 6, a capacitor provided between the output side of the reactor 5 and one pole of the DC voltage source 2.

Reference numerals 7 and 8 denote a saturable reactor and a peaking capacitor, respectively, provided in the discharge route of the capacitor 6. Reference numeral 9 denotes a discharge tube connected in parallel to the peaking capacitor 8. Reference numeral 11 denotes a diode for rectifying a reverse-polarity voltage across the capacitor 6 and inputting a rectified voltage to a transformer 10, numeral 12 denotes a high-frequency bypass capacitor provided on the output side of the transformer 10, and numeral 13 denotes an inverter that has the voltage across the capacitor 12 as an input and whose output serves as an input of the DC voltage source 2, that is, whose output is connected in parallel to the AC power source 1.

Next, the operation of the pulsed power supply device of FIG. 10 will be described with reference to a time chart of FIG. 11.

First, the capacitor 3 is charged to have a high voltage by the DC voltage source 2 that is powered by the AC power source 1. Then, as soon as the switched 4 is turned on at time t1, the charge of the capacitor 3 is released via the reactor 5 and the capacitor 6 is charged quickly. During this charging process, the saturable reactor 7 prevents charging of the peaking capacitor 8. When in due course the saturable reactor 7 has been saturated at time t2 and the circuit inductance has decreased greatly, discharging of the capacitor 6 and charging from the capacitor 6 to the peaking capacitor 8 is started. When the voltage across the peaking capacitor 8 has reached a predetermined value at time t3, the discharge tube 9 is discharged and comes to exhibit low impedance, whereby the peaking capacitor 8 is discharged. The switch 4 is opened when the voltage across the capacitor 3 has become approximately zero. Pulses are generated repetitively by repeating the above operation.

In the above operation, a current is supplied to each of the capacitor 6, the peaking capacitor 8, and the discharge tube 9 by a resonance phenomenon caused by the capacitance of the capacitors involved and the circuit inductance. The resonance frequency gradually increases (that is, the pulse duration gradually decreases and the peak voltage increases) by making a setting that a capacitor closer to the last stage has a smaller capacitance value. Finally, a large, steep current flows through the discharge tube 9.

The above type of circuit is called a magnetic compression circuit or a pulse compression circuit (the term "pulse compression circuit" will be used hereinafter). In this pulse compression circuit, an oscillation phenomenon is utilized in the above manner in transferring energy from an upstream capacitor to a downstream capacitor. If the circuit constants were not appropriate and the circuits were not matched with each other in discharge impedance, voltages would remain in the capacitor 6 and the peaking capacitor 8 after a discharge. There is an outstanding subject that such residual energy should be minimized. For example, Japanese Unexamined Patent Publication No. Hei. 4-200281 discloses that the capacitance ratio of upstream and downstream capacitors is set at 1:0.7 to 1:1.

In the device of FIG. 10, a voltage having a reverse polarity generated across the capacitor 6 by an oscillation (resonance) phenomenon is applied between the input terminals of the transformer 10 with the diode 11 turned on. Therefore, a current flows through the diode 11 and the transformer 10 from the capacitor 6 or the peaking capacitor 8, to charge the capacitor 12 that is connected to the output side of the transformer 10. And the energy that has not been dissipated by the resistance component of the circuit during the resonance phenomenon is stored in the capacitor 12. The energy stored in the capacitor 12 is converted to an AC voltage by the inverter 13 and reused as an input of the DC voltage source 2.

The above-described method in which energy is recollected via an AC circuit has a problem of large energy loss in the stage of AC-to-DC conversion.

A second background technique is known that is intended to solve this problem. In this technique, as disclosed in Japanese Unexamined Patent Publication No. Hei. 9-148657, for example, a secondary winding is provided in a saturation transformer (corresponding to the saturating reactor 7 shown in FIG. 10) in a DC circuit and energy is recollected so as to be supplied to the DC side of the DC voltage source 2 via an energy regeneration circuit that is connected to the secondary winding.

In the conventional pulsed power supply device having the above configuration, unnecessary power that is not consumed in the discharge tube is regenerated via AC devices such as a transformer and an inverter. Therefore, the conventional pulsed power supply device is voluminous and costly. Further, since regenerated power occurs on the AC input side, the output capacity of the DC voltage source is required to accommodate such excess power and hence the DC voltage source becomes voluminous. Since power is regenerated via many devices such as a DC voltage source, a transformer, and an inverter, there arises a problem that power loss in the circuit makes it difficult to increase the efficiency.

Because regenerated energy occurs on the DC output side of the DC voltage source, the second background technique is free of the above kind of loss in efficiency and economy that is caused by the AC circuit. However, since a current flowing through the saturable reactor is regenerated via the secondary winding, there is a problem that the loss is large and the efficiency is not high.

The present invention has been made to solve the above problems, and an object of the invention is therefore to enable high-efficiency regeneration of power, specifically, a voltage (energy) remaining in a capacitor of a DC circuit only by means of the output side of a DC voltage source without requiring AC devices such as an inverter and a transformer and to make it unnecessary to provide a secondary winding in a reactor, to thereby reduce the output capacity of the DC power source, increase the efficiency of a pulsed power supply device, and decrease its size and cost.

Another object of the invention is to present a more appropriate selection range of circuit constants in further increasing the voltage of generated pulses by using a pulse width compression circuit in a pulsed power supply device that has been invented to attain the above object.

DISCLOSURE OF THE INVENTION

A pulsed power supply device according to the invention comprises a DC voltage source and first and second series circuits connected to each other in series and provided between positive and negative output terminals of the DC voltage source, the first series circuit being a series circuit of a first reactor and a first forward-direction diode and the second series circuit being a series circuit of a second forward-direction diode and a switch, wherein a third series circuit that is a series connection of a capacitor, a second reactor, and a discharge tube is connected in parallel to the second series circuit. A reverse-polarity voltage is left in the capacitor by a current that is caused to flow in an oscillatory manner by the capacitor and the second reactor. This voltage is reused in the next charging in such a manner as to be added to a voltage of the power source.

In a pulsed power supply device of the invention, the second series circuit of the second forward-direction diode and the switch has a saturable reactor that is connected in series thereto. The saturable reactor prevents a current reverse flow during a recovery period of the diode.

In a pulsed power supply device of the invention, the second forward-direction diode has a resistor that is connected in parallel thereto. The resistor shortens the recovery period of the second forward-direction diode.

In a pulsed power supply device of the invention, the connection order in each of the series circuits is so set that the first forward-direction diode, the second forward-direction diode, and the capacitor are connected to a connecting point of the first, second, and third series circuits, and a three-terminal T-shaped circuit constituted of the first forward-direction diode, the second forward-direction diode, and the capacitor is configured in such a manner that a plurality of three-terminal T-shaped circuits each constituted of two diodes and a capacitor are connected to each other in parallel. The use of a plurality of three-terminal T-shaped circuit can improve a current balance.

In a pulsed power supply device of the invention, the second series circuit of the second forward-direction diode and the switch is configured in such a manner that plural sets of a diode and a semiconductor switch device that are connected to each other in series are connected to each other in series.

In a pulsed power supply device of the invention, each of the sets, constituting the second series circuit, of the second forward-direction diode and the semiconductor device that are connected to each other in series has surge voltage inhibiting means that is a series connection of a capacitor and a resistor and is connected in parallel to the set.

Another pulsed power supply device of the invention comprises a DC voltage source and first and second series circuits connected to each other in series and provided between positive and negative output terminals of the DC voltage source, the first series circuit being a series circuit of a first reactor and a first forward-direction diode and the second series circuit being a series circuit of a second forward-direction diode and a switch, wherein the pulsed power supply device comprises a series circuit of a first saturable reactor, a first capacitor, and a second capacitor, the series circuit being connected in parallel to the second series circuit, wherein the pulsed power supply device further comprises a pulse compression circuit that has a second saturable reactor and a third capacitor and is connected in parallel to the second capacitor, and wherein the pulsed power supply device comprises a discharge tube that is connected in parallel to the third capacitor of the pulse compression circuit.

In a pulsed power supply device of the invention, the ratio of the capacitance of the second capacitor to that of the first capacitor or the ratio of the capacitance the third capacitor to that of the second capacitor is set in a range of 0.25 to 0.75. This capacitance ratio enables an efficient voltage boost.

BEST MODE FOR CARRYING OUT THE INVENTION

Embodiment 1

A first embodiment of the present invention will be hereinafter described with reference to FIGS. 1 and 2.

Figure 1:
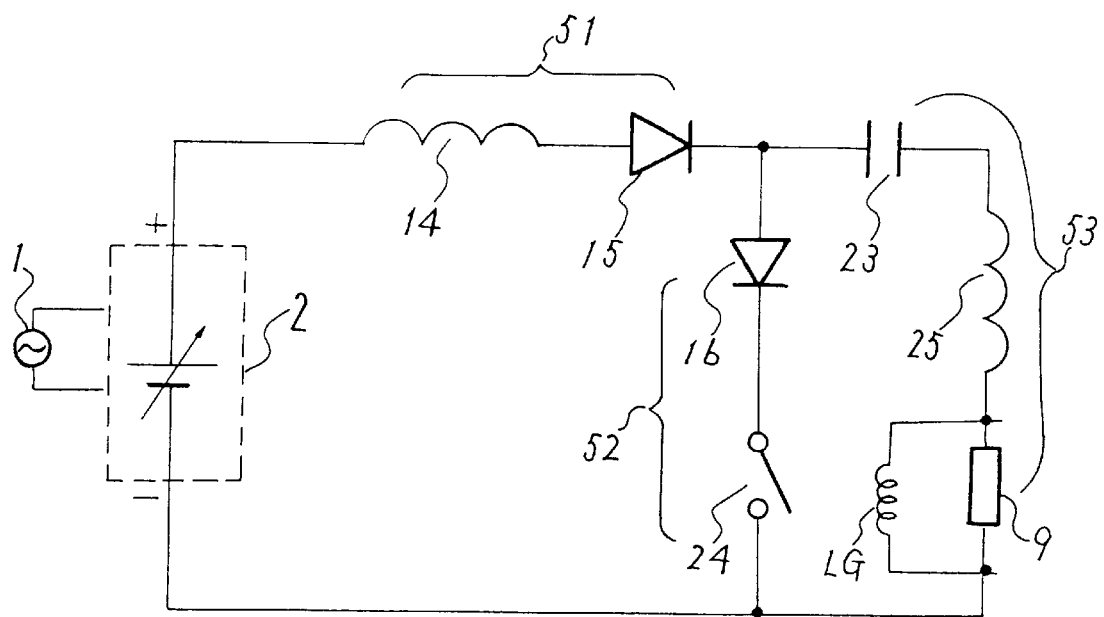
FIG. 1 is a circuit diagram of a pulsed power supply device according to a first embodiment of the present invention.

FIG. 1 is a circuit diagram of a pulsed power supply device according to the first embodiment of the invention. In the figure, reference numeral 1 denotes an AC power source that supplies power; 2, a DC voltage source that has the AC power source 1 as an input and generates a high DC voltage; 14, a first reactor connected to the DC output side of the DC voltage source 2; and 15, a first forward-direction diode connected in series to the DC voltage source 2 in the forward direction. The first reactor and the first forward-direction diode constitute a first series circuit 51.

Reference numeral 16 denotes a second forward-direction diode connected to the first forward-direction diode in the forward direction, and numeral 24 denotes a switch that is connected in series to the second forward-direction diode 16 and also connected, at the other end, to the DC voltage source 2. The second forward-direction diode 16 and the switch 24 constitute a second series circuit 52.

Reference numeral 23 denotes a capacitor connected to the connecting point of the first forward-direction diode 15 and the second forward-direction diode 16. Reference numeral 25 denotes a second reactor connected in series to the capacitor 23, and numeral 9 denotes a discharge tube that is connected in series to the second reactor 25 and also connected, at the other end, to the DC voltage source 2. A charging reactor LG is connected in parallel to the discharge tube 9. The capacitor 23, the second reactor 25, and the discharge tube 9 constitute a third series circuit 53.

The operation of the circuit of FIG. 1 will be described with reference to a time chart of FIG. 2.

For convenience of description, a description will be made by dividing the time range of FIG. 2 into mode-1 to mode-5. The vertical axes of FIG. 2 represent a voltage waveform of the capacitor 23, a current waveform of the switch 24, a current waveform of the first reactor 14, a current waveform of the discharge tube 9, the state of the first forward-direction diode 15, the state of the second forward-direction diode 16, and the opening/closing state of the switch 24.

A description will be made with an assumption that the impedance of the discharge tube 9 has an extremely small value during its discharge.

Mode-1

When a voltage is supplied from the AC power source 1, a current flows along a route formed by the first reactor 14, the first forward-direction diode 15, the capacitor 23, the second reactor 25, and the charging reactor LG, whereby the capacitor 23 is charged to have a voltage V3 with at the terminal that is connected to the first forward-direction diode 15 given a positive polarity.

Mode-2

When the switch 24 is turned on in a state that the capacitor 23 has been charged sufficiently, the charge of the capacitor 23 is released via the second series circuit 52 and the third series circuit 53, that is, along a route formed by the second forward-direction diode 16, the switch 24, the discharge tube 9, and the second reactor 25.

Since this circuit is a series resonance circuit of L, C, and R, as is well known an oscillation current is generated if $R < 2 \cdot (L/C)^{1/2}$ is satisfied where C is the capacitance value of the capacitor 23, L is the inductance value of the second reactor 25, and R is the resistance value of the discharge tube 9 during a discharge.

That is, the energy is not fully dissipated by the discharge tube 9 even after the voltage across the capacitor 23 becomes zero, and the current continues to flow. As time elapses, the capacitor 23 is charged to have a voltage VR whose polarity is opposite to the polarity at the time of the charging.

Figure 2:
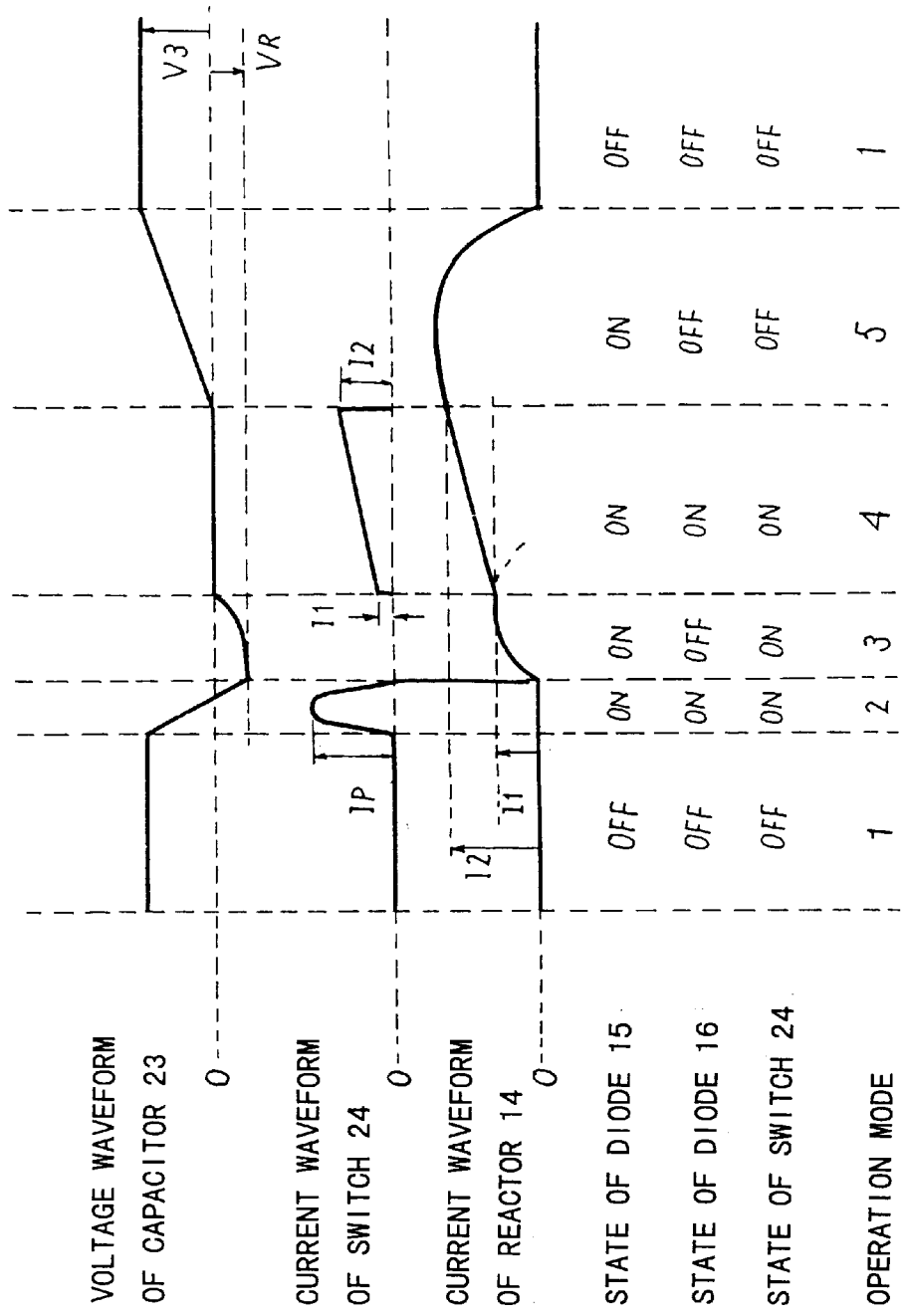
FIG. 2 is a time chart for description of the operation of the circuit of FIG. 1.

As shown in FIG. 2, the current flowing through the switch 4 approximately assumes a half sine wave having a peak value IP and the voltage across the capacitor 23 comes to have as polarity opposite to the polarity at the time of the charging.

Mode-3

Then, the reverse-polarity voltage across the capacitor 23 causes a current to flow through the discharge tube 9 in the reverse direction. Because of the presence of the second forward-direction diode 16, the current flows, to discharge the capacitor 23, along a route formed by the third series circuit 53, the DC voltage source 2, and the first series circuit 51, that is, the capacitor 23, the second reactor 25, the discharge tube 9, the DC voltage source 2, the first reactor 14, and the first forward-direction diode 15.

If the impedance of the first reactor 14 is sufficiently larger than the resistance value of the above route, the reverse voltage across the capacitor 23 decreases with an oscillation condition that is roughly determined by the capacitance value of the capacitor 23 and the inductance value of the first reactor 14. On the other hand, the current continues to increase; the current flowing through the first reactor 14 has a maximum value I1 at a time point when the voltage across the capacitor 23 becomes zero.

At this time point, all the electrostatic energy that was stored in the capacitor 23 has been converted to electromagnetic energy of the first reactor 14.

Mode-4

When the reverse voltage across the capacitor 23 has decreased to zero, the second forward-direction diode 16 is again turned on, the ongoing current changes its route to a route formed by the first reactor 14, the first forward-direction diode 15, the second forward-direction diode 16, and the switch 24. Since this current is caused by the voltage of the DC voltage source 2, it increases monotonously.

Mode-5

Then, the switch 24 is forcibly turned off when the current flowing through the reactor 14 has increased to a predetermined value I2, whereby a voltage is generated across the first reactor 14 as the current comes to decrease. The sum of this voltage and the voltage of the DC voltage source 2 causes a current to flow in the direction from the first reactor 14 to the capacitor 23 with the current flowing through the first reactor 14 as an initial value, whereby the capacitor 23 is charged to have a voltage larger than the output voltage of the DC voltage source 2.

This operation continues until the current flowing through the first reactor 14 becomes zero and the first forward-direction diode 15 is turned off. When the first forward-direction diode 15 has been turned off and the operation of charging the capacitor 23 has completed, the operation returns to the state of mode-1. That is, while V3 takes a constant value if I2 has a constant value, as I1 increases the current increasing period of the reactor 14 (i.e., the output current increasing period of the DC voltage source 2) becomes shorter and hence the output capacity of the DC voltage source 2 can be smaller.

As the above operation is repeated, the electrostatic energy stored in the capacitor 23 is given to the discharge tube 9 by turning on the switch 24, and energy that has not been consumed is temporarily held by the capacitor 23 in the reverse polarity and then converted to electromagnetic energy of the first reactor 14, which is then converted to a voltage by turning off the switch 24. The resulting voltage can be reused so as to be added to the voltage of the DC voltage source 2 in the subsequent charging operation.

According to this pulsed power supply device, since a voltage that is generated by an oscillation current of the circuit and remains in the capacitor in the reverse polarity is added to the DC output side of the DC voltage source and reused in the subsequent charging of the capacitor, regeneration of unnecessary power that has not been consumed by the discharge tube is performed within the DC circuit without using AC devices such as a transformer and an inverter. Therefore, the output capacity (peak value) of the DC voltage source can be made smaller than the energy stored in the capacitor, whereby the efficiency can be improved, the device size can be reduced, and the cost can be reduced.

It goes without saying that in the above description the order of connection of the circuit elements in each of the first series circuit 51, the second series circuit 52, and the third series circuit 53 may not be exactly the one shown in FIG. 1. The discharge tube 9 may be replaced by a load other than a discharge tube (though it should satisfy the above impedance condition).

Embodiment 2

A pulsed power supply device according to a second embodiment of the invention will be described below with reference to FIG. 3.

Figure 3:
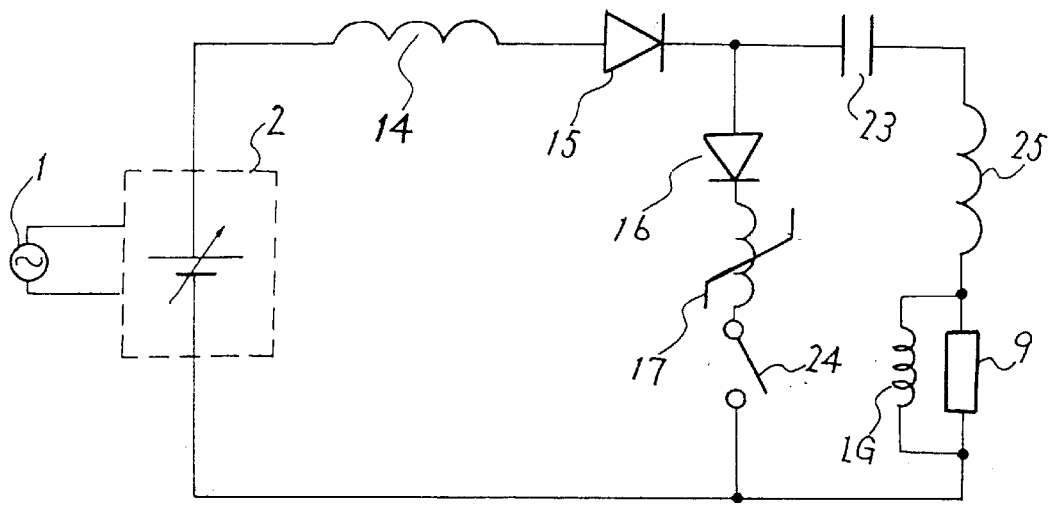
FIG. 3 is a circuit diagram of a pulsed power supply device according to a second embodiment of the invention.

In FIG. 3, reference numeral 17 denotes a saturable reactor that is inserted in series with the second series circuit 52, that is, the switch 24 and the second forward-direction diode 16. In the following drawings, the elements having the same reference numerals as those in FIG. 1 are the same as or correspond to the latter and hence will not be described in detail.

In mode-2 described in the first embodiment, when the switch 24 has been turned on, there is force of causing a current to flow through a loop formed by the capacitor 23, the second forward-direction diode 16, the saturable reactor 17, the switch 24, the discharge tube 9, and the second reactor 25. However, since the saturable reactor 17 has high impedance, a current flow is prevented with a voltage applied to the saturable reactor 17.

Then, after a lapse of a time corresponding to the voltage-time product that saturates the saturable reactor 17, the saturable reactor 17 is rendered in a low-impedance state because of a saturation phenomenon in its magnetic characteristic, whereby a half-sine-wave-like current flows in the forward direction of the second forward-direction diode 16 and the capacitor 23 is charged in the reverse polarity, as in the case of mode-2 of the first embodiment.

When the current has become zero, the reverse voltage turns off the second forward-direction diode 16. If the duration of the half-sine-wave-like current pulse is as short as several hundred nanoseconds, for example, the second forward-direction diode 16 is required to have an extremely fast recovery characteristic. However, even with a diode that is available on the market and has a superior characteristic, the electrostatic energy of the capacitor 23 in the form of a reverse voltage cannot be held completely if the recovery current has a large rise. There may occur a case that the stored charge is released instantly as a diode recovery current. In contrast, where the saturable reactor 17 is inserted, it exhibits high impedance also against the reverse current and can prevent a current from starting to flow during its saturation period.

That is, the saturable reactor 17 that has been saturated by the forward current flowing through the second forward-direction diode 16 exhibits high impedance against the reverse current and hence prevents sudden charge leakage during the recovery of the diode 16, and turns off the second forward-direction diode 16 by a leak current during the period when the saturable reactor 17 exhibits high impedance by the time when the product of the reverse voltage and time will reach the above-mentioned level.

As described above, by inserting the saturable reactor 17, the reverse voltage of the capacitor 23 can be held almost completely irrespective of the level (good or poor) of the recovery characteristic of the second forward-direction diode 16. Therefore, no influence occurs on the energy recollecting operation described in the first embodiment.

Since the invention does not use a secondary winding in a reactor to regenerate energy so that it is supplied to the DC output side of the DC voltage source, the efficiency can further be increased.

Embodiment 3

A pulsed power supply device according to a third embodiment of the invention will be described below with reference to FIG. 4.

Figure 4:
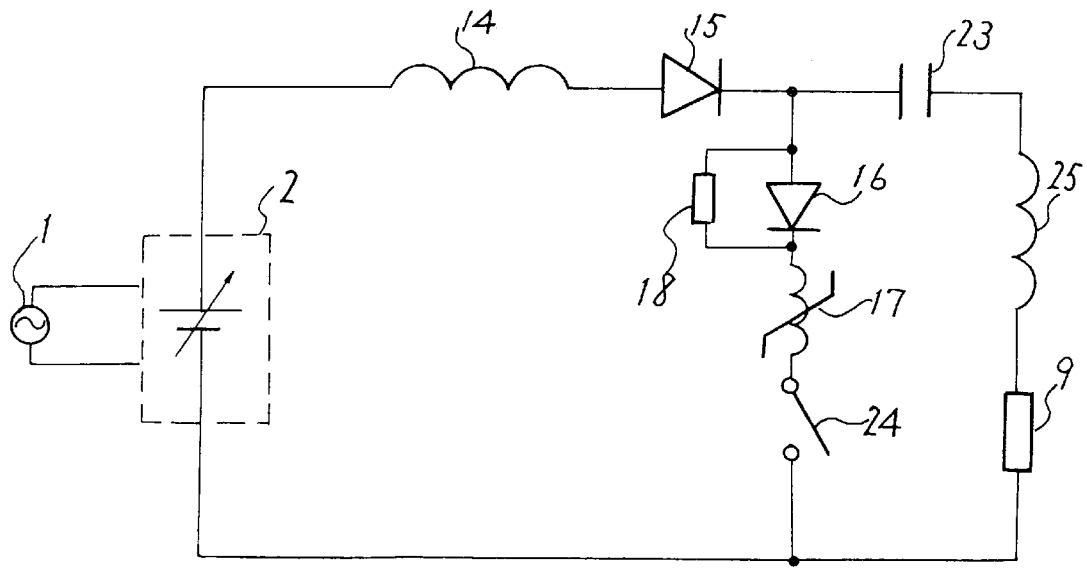
FIG. 4 is a circuit diagram of a pulsed power supply device according to a third embodiment of the invention.

In FIG. 4, reference numeral 18 denotes a resistor that is connected in parallel to the second forward-direction diode 16. Although in the following description the charging reactor LG will not be illustrated for the convenience of illustration, it is actually used as in the case of FIG. 1.

To turn off the forward-direction diode 16 more reliably and quickly than in the second embodiment shown in FIG. 3, recovery charge for the diode 16 is caused to flow so as to be restricted by the resistor 18 during the period when the saturable reactor 17 exhibits high impedance.

While the saturable reactor 17 prevents charge from being released at high speed in a large amount from the capacitor 23 that is charged in the reverse polarity, a current that is restricted by the resistor is caused to flow in the reverse direction of the diode 16 in addition to a leak current of the saturable reactor, whereby the diode 16 can be turned off quickly and more reliably.

Embodiment 4

A pulsed power supply device according to a fourth embodiment of the invention will be described below with reference to FIG. 5.

Figure 5:
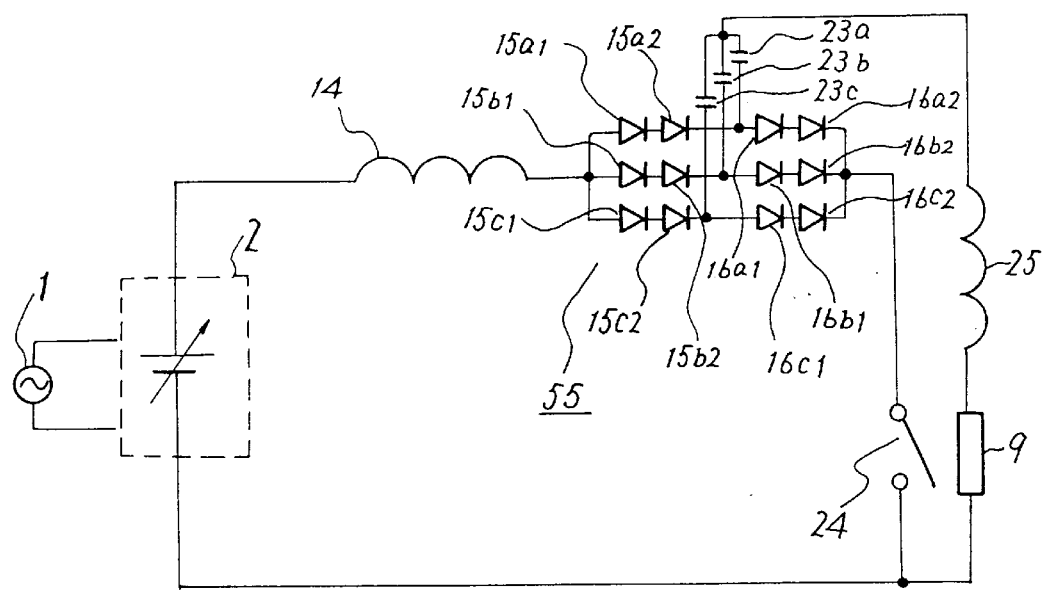
FIG. 5 is a circuit diagram of a pulsed power supply device according to a fourth embodiment of the invention.

The circuit of FIG. 5 is directed to a case where the circuit voltage and current applied to the discharge tube are large and hence it is necessary to connect together a plurality of diodes in series and in parallel.

In the circuit of the first embodiment shown in FIG. 1, the first forward-direction diode 15, the second forward-direction diode 16, and the capacitor 23 constitute a three-terminal T-shaped circuit. In FIG. 5, the three-terminal T-shaped circuit is formed by using series/parallel-connected diodes.

In FIG. 5, reference symbols 15a1 and 15a2 denote diodes that are connected to each other in series in multiple stages (as few as two stages in the figure) and correspond to the first forward-direction diode 15 of the first embodiment shown in FIG. 1, and symbols 16a1 and 16a2 denote diodes that are also connected to each other in series in multiple stages and correspond to the second forward-direction diode 16 of the first embodiment.

Reference symbols 15b1, 15b2, 16b1, and 16b2 denote diodes that are similarly connected to each other in multiple stages.

Reference symbols 15c1, 15c2, 16c1, and 16c2 denote diodes that are similarly connected to each other in multiple stages.

Further, reference symbols 23a, 23b, and 23c denote capacitors in which each of one terminals is common to the connecting point of the diodes 15a2 and 16a1, 15b2 and 16b1, or 15c2 and 16c1 and the other terminals are connected to each other in parallel and connected to the second reactor 25. The above diodes and capacitors constitute a three-terminal T-shaped circuit 55.

The capacitors 23a, 23b, and 23c are charged in the forward direction of the diodes 15a1 and 15a2, 15b1 and 15b2, and 15c1 and 15c2, respectively. The capacitors 23a, 23b, and 23c are discharged via the diodes 16a1 and 16a2, 16b1 and 16b2, and 16c1 and 16c2, respectively, by turning on the switch 24.

In FIG. 5, the number of series-connected diodes is four and the number of parallel-connected diodes is set at three to divide the charging/discharging capacitor into three parts. The current division can be made more even as the number of series-connected diodes increases.

The circuit having the above configuration can not only deal with a high voltage and a large current but also enables a more compact implementation as will be described in a seventh embodiment by integrating a diode section and a capacitor section.

Embodiment 5

A pulsed power supply device according to a fifth embodiment of the invention will be described below with reference to FIG. 6.

Figure 6:
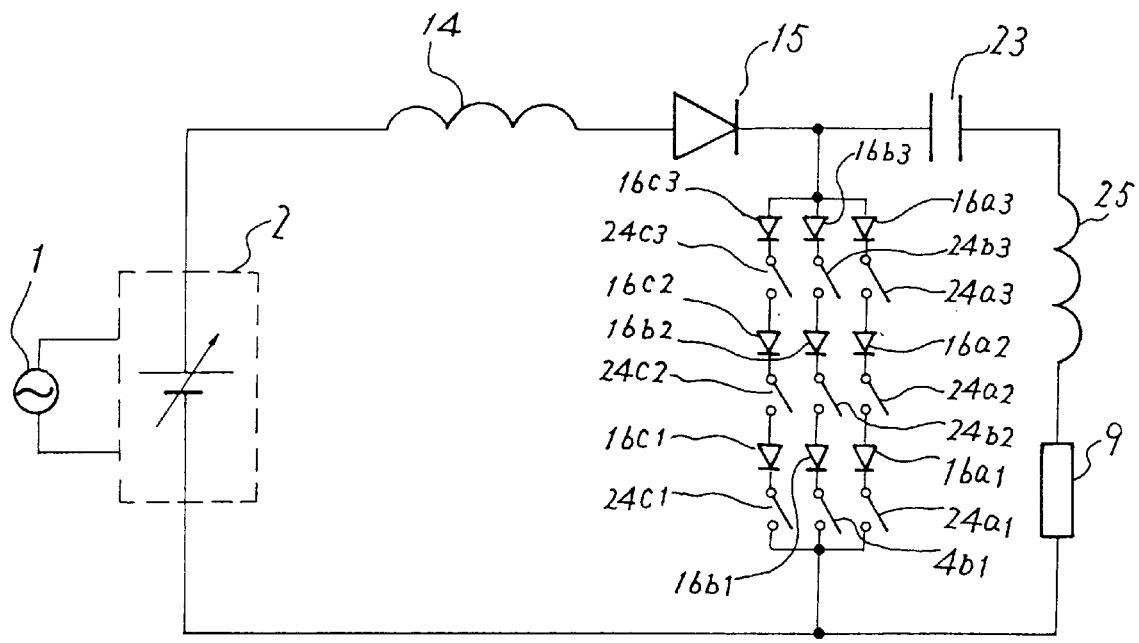
FIG. 6 is a circuit diagram of a pulsed power supply device according to a fifth embodiment of the invention.

In FIG. 6, reference symbols 24a1, 24a2, 24a3, 24b1, 24b2, 24b3, 24c1, 24c2, and 24c3 denote switches that are semiconductor devices.

Reference symbols 16a1, 16a2, 16a3, 16b1, 16b2, 16b3, 16c1, 16c2, and 16c3 denote diodes that are connected in series to the respective semiconductor devices.

In the case where the switch means is configured in such a manner that series connections of multiple semiconductor devices are connected together in parallel, a diode is connected in series to each semiconductor device.

When the switch means are off, that is, when all of the semiconductor devices 16a1–16c3 are off, a charged voltage of the capacitor 23 is distributed to the series-connected semiconductor devices.

When the semiconductor devices 16a1–16c3 are thereafter turned on simultaneously, a discharge current from the capacitor 23 flows so as to be distributed to the parallel groups approximately evenly.

When the capacitor 23 is charged to have a voltage having the polarity opposite to the polarity at the time of the charging, the voltage is applied to the respective diodes as reverse bias voltages even if the semiconductor devices remain on, whereby the diodes are turned off. The reverse-polarity charged voltage of the capacitor 23 is held, and the reverse bias voltages obtained by dividing it approximately evenly are kept in the respective diodes.

The circuit having the above configuration can not only deal with a high voltage and a large current but also enables a more compact implementation as will be described in a seventh embodiment by integrating a diode section a the switch section.

Embodiment 6

A pulsed power supply device according to a sixth embodiment of the invention will be described below with reference to FIG. 7.

Figure 7:
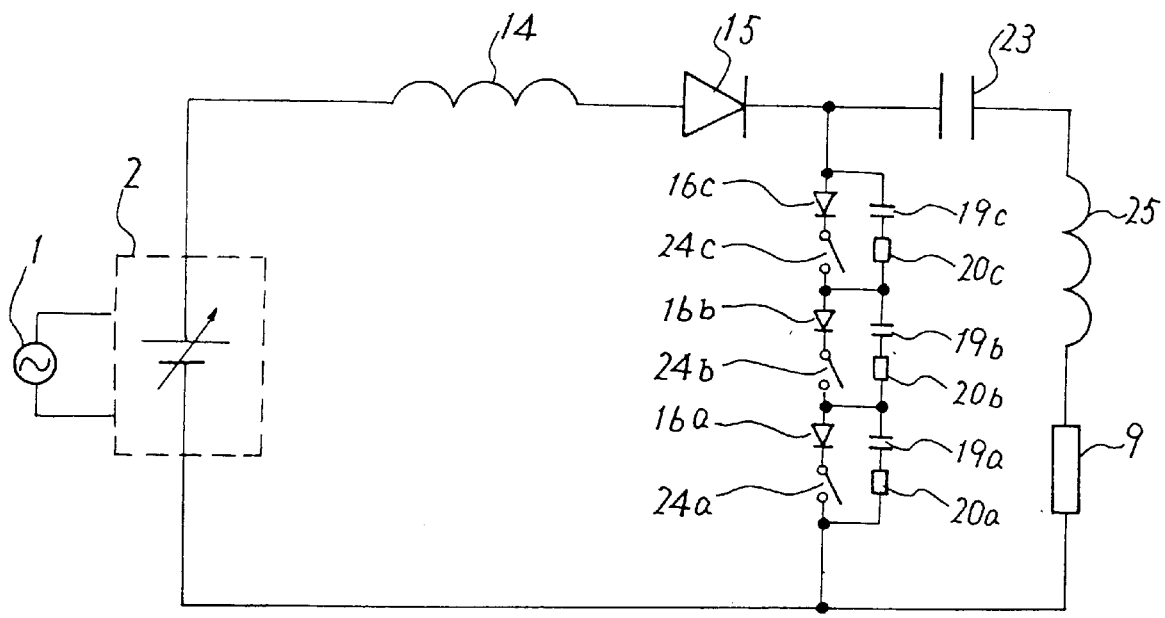
FIG. 7 is a circuit diagram of a pulsed power supply device according to a sixth embodiment of the invention.

In FIG. 7, reference symbols 24a, 24b, and 24c denote switches that are semiconductor devices. Reference symbols 16a, 16b, 16c denote diodes that are connected in series to the respective semiconductor devices 24a, 24b, and 24c. One semiconductor device and one diode connected thereto in series constitute one set.

Each set of reference symbols 19a and 20a, 19b and 20b, and 19c and 20c denote a capacitor and a resistor that constitute a snubber circuit (surge absorber).

The structure that the semiconductor devices 24a, 24b, and 24c and the diodes 16a, 16b, and 16c are connected together in series is the same as in the fifth embodiment shown in FIG. 6.

One snubber circuit consisting of a capacitor and a resistor is provided for each set of a semiconductor device and a diode.

For example, the diode 16a and the semiconductor device 24a are connected to each other in series, and the series connection of the capacitor 19a and the resistor 20a is connected to the anode side of the diode 16a and one terminal of the resistor is connected to the semiconductor device 24a.

When the capacitor 23 is charged, the capacitor 19a is also charged via the resistor 20a.

The same is true of the capacitors 19b and 19c.

That is, when the capacitor 23 is charged, the capacitors 19a–19c equalize the voltages applied to the semiconductor devices 24a–24c and prevent rapid voltage increase.

The semiconductor devices 24a–24c are turned on simultaneously, the capacitor 23 is discharged, and then the capacitor 23 is charged in the polarity opposite to the polarity at the time of the charging, whereupon the diodes 16a–16c are turned off and voltages develop there in the reverse bias direction. Since the capacitors 19a–19c are charged in the direction opposite to the direction in the above operation, they equalize the voltages applied to the diodes 16a–16c and prevent rapid voltage increase.

Since the surge inhibiting means such as a snubber circuit consisting of a capacitor and a resistor is provided for each set of a semiconductor device and a diode, the semiconductor devices are protected from overvoltage application when forward voltages are applied thereto, the diodes are done so when reverse voltages are applied thereto, and the distribution voltages are equalized.

Embodiment 7

Figure 8:
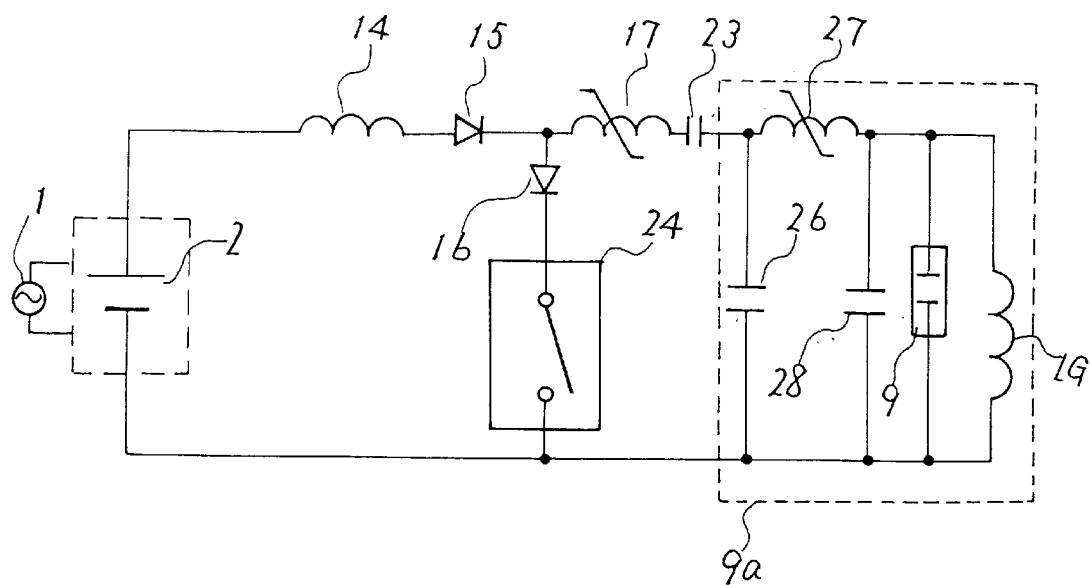
FIG. 8 is a circuit diagram of a pulsed power supply device according to a seventh embodiment of the invention.
Figure 10:
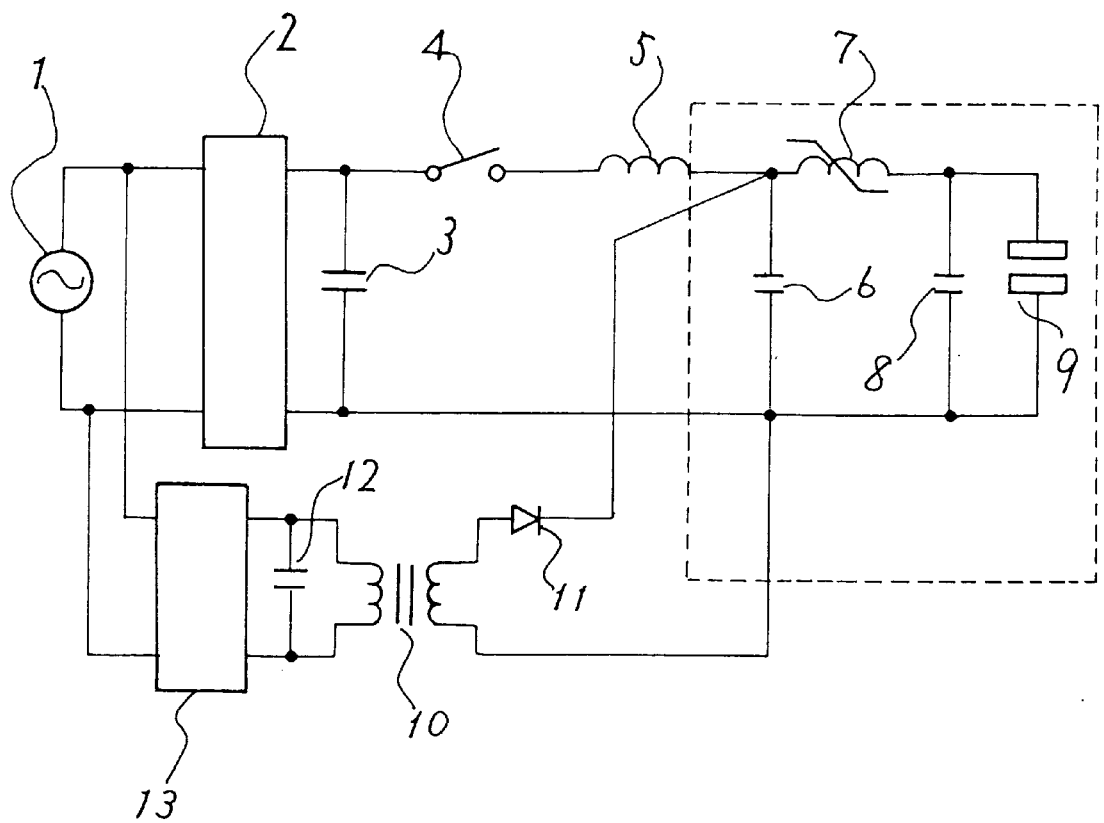
FIG. 10 is a circuit diagram of a conventional pulsed power supply device.
Figure 11:
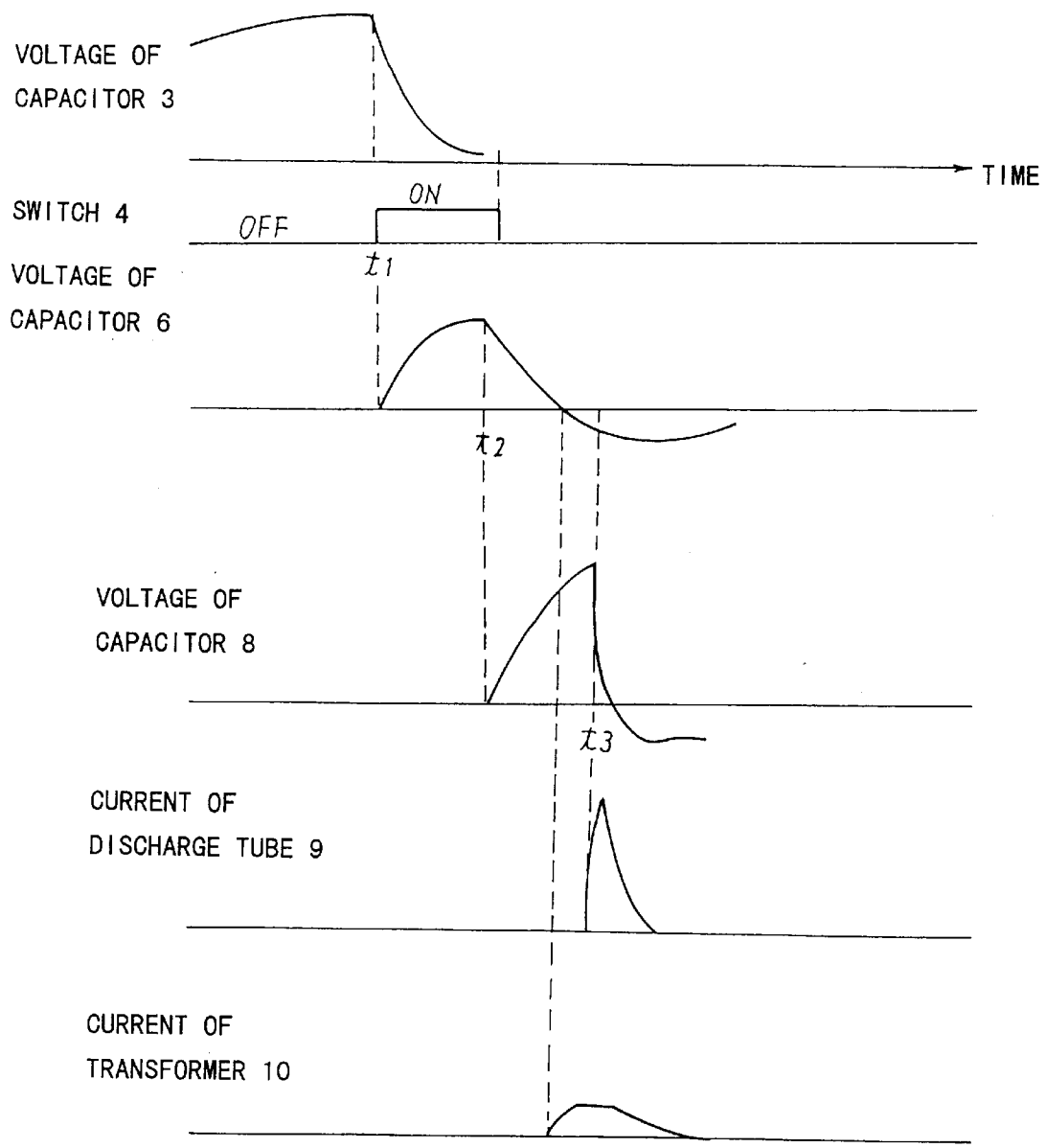
FIG. 11 is a time chart for description of the operation of FIG. 10.

The pulse compression circuit as described in the background section with reference to FIG. 10 can also be used in the above-described pulsed power supply device of each embodiment. FIG. 8 shows an example in which such a pulse compression circuit is used in the invention.

In FIG. 8, reference numeral 17 denotes a first saturable reactor connected in series to the capacitor 23; 26, a second capacitor provided downstream of the capacitor 23; 27, a second saturable reactor; and 28, a third capacitor.

The second saturable reactor 27 and the second capacitor 28 are connected to each other in series and form a discharge loop of the capacitor 26.

A discharge tube 9 is connected in parallel to the third capacitor 28, and a charging reactor LG is further connected in parallel to serve as a bypass route during charging.

When the switch 24 is turned off at a time point when a current flowing through the reactor 14 upon turning-on of the switch 24 has reached a large value, the capacitor 23 is charged to have a high voltage by the voltage of the DC voltage source 2 and an induction voltage developing across the reactor 14.

When the switch 24 is thereafter turned on, the capacitor 23 is discharged and the second capacitor 26 is charged quickly. In this charging process, the second saturable reactor 27 prevents charging to the third capacitor 28. When in due course the second saturable reactor 27 has been saturated and its inductance has decreased greatly, discharging of the second capacitor 26 and charging from the second capacitor 26 to the third capacitor 28 is started.

When the voltage across the third capacitor 28 has reached a predetermined value, the discharge tube 9 is discharged and comes to exhibit low impedance, whereby the third capacitor 28 is discharged. Therefore, a current and hence power are supplied to the discharge tube 9. In the above operation, a charging current is supplied to each of the second capacitor 26 and the third capacitor 28 by a oscillation phenomenon that depends on the capacitance value of the capacitors involved and the inductance value of the circuit. If the electrostatic capacitance value ratio among the capacitor 23, the second capacitor 26, and the third capacitor 28 is represented by C3:C6:C8, the circuit loss is disregarded, and theoretical steady-state charged voltages of the respective capacitors are represented by V3, V6, and V8, the following relationships hold:

$$V6 = V3 \times 2/(1 + C6/C3)$$

$$V8 = V6 \times 2/(1 + C8/C6)$$

If C3:C6:C8=4:2:1, for example, V8 is calculated as $$V8=1.33 \times V6=1.33 \times 1.33 \times V3=1.77 \times V3.$$

That is, the charged voltage of each capacitor is increased by a factor of 1.33 as the stage proceeds rearward. Since the capacitance value of the capacitor decreases, the oscillation frequency increases and the voltage and current waveforms become steeper.

On the other hand, voltages V3' and V6' remaining in the capacitor 23 and the second capacitor 26, respectively, are given by $$V3'=V3 \times (1-C6/C3)/(1+C6/C3)$$

$$V6'=V6 \times (1-C8/C6)/(1+C8/C6).$$

If C3:C6:C8=4:2:1, for example, V3' and V6' are calculated as $$V3'=0.33 \times V3$$

$$V6'=0.33 \times V6.$$

That is, a voltage of ⅓, that is, electrostatic energy of ⅑, remains in each of the capacitor 23 and the second capacitor 26. Since the oscillation phenomenon is utilized in the above manner, after the discharging of the third capacitor 28, energy that has not been consumed by the resistance component of the discharge tube appears as a reverse voltage in the third capacitor 28, for example, in addition to the above residual energy.

Most of this electrostatic energy serves to cause discharging in the forward direction of the diode 16 along a closed loop formed by the third capacitor 28, the second saturable reactor 27, the capacitor 23, the first saturable reactor 17, the second forward-direction diode 16, and the switch 24, whereby the capacitor 23 is charged in the polarity opposite to the polarity at the time of the charging.

The residual energy of the capacitor 23 causes discharging in the forward direction of the diode 16 along a closed loop formed by the capacitor 23, the first saturable reactor 17, the second forward-direction diode 16, the switch 24, the discharge tube 9 in the low-impedance state, and the second saturable reactor 27, whereby the capacitor 23 is charged in the polarity opposite to the polarity at the time of the charging.

The residual energy of the second capacitor 26 causes a current to flow along a closed loop formed by the second capacitor 26, the discharge tube 9 in the low-impedance state, and the first saturable reactor 17, whereby the charged voltage of the second capacitor 26 is reversed and it is stored in the reverse polarity. Then, the second capacitor 26 is discharged in the forward direction of the diode 16 along a closed loop formed by the second capacitor 26, the capacitor 23, the first saturable reactor 17, the second forward-direction diode 16, and the switch 24. The capacitor 23 is charged in the polarity opposite to the polarity at the time of the charging.

As described above, the electrostatic energy remaining in each capacitor causes a current to flow in the forward direction of the second forward-direction diode 16 along the route including the second forward-direction diode 16 and the switch 24, whereby most of the energy serves to charge the capacitor 23 in the polarity opposite to the polarity at the time of the initial charging. All of those operation currents flow in the direction of saturating the first saturable reactor 17 and the second saturable reactor 27; the high impedance prevents current flows in the reverse direction. The route including the discharge tube 9 is effective with the assumption that the discharge tube 9 exhibits low impedance. If the discharge tube 9 is in a state that its impedance component is not negligible, a current flows through the charging reactor LG that is connected in parallel to the discharge tube 9 bypassing the discharge tube 9.

Then, before the saturable reactors 17 and 27 are saturated in the reverse direction by the reverse voltage across the capacitor 23, the reverse voltage across the capacitor 23 serves as a reverse bias source for the diode 16 and turns it off.

Therefore, a current flows along a closed loop formed by the capacitor 23, the second saturable reactor 27, the discharge tube 9, the DC voltage source 2, the reactor 14, the first forward-direction diode 15, and the first saturable reactor 17. The current flowing through the reactor 14 has a maximum value when the reverse voltage across the capacitor 23 becomes zero, which means that the electrostatic energy that remained in each capacitor has been converted to electromagnetic energy of the reactor 14.

When the reverse voltage of the capacitor 23 has become zero, the second forward-direction diode 16 is turned on and an increasing current flows through the DC voltage source 2 via the switch 24 that has remained on, whereby the electromagnetic energy of the reactor 14 is increased.

When the switch 24 is turned off at a time point when this current has reached a predetermined value, the operation of charging the capacitor 23 is restarted with the current at this time point as an initial value.

The above operation enables recollection of residual energy in the case where the pulsed power supply is loaded with a discharge tube via a pulse compression circuit that is a combination of capacitors and a saturable reactor.

Therefore, for example, in the case of two-stage compression, it is less necessary to determine the ratio among the first, second, and third capacitors so as to mainly aim at reducing the energy residual amounts in the respective capacitors.

Since for the capacitance value of the capacitor of each stage the capacitance value of the next stage can be determined mainly to increase the voltage, the charged voltage of the first-stage capacitor, for example, can be made lower than in the conventional case and hence the breakdown voltage performance level required for the switch can be lowered greatly.

The above point will be described further in a quantitative manner.

With a notation that a voltage boost ratio V6/V3 from the capacitor 23 to the second capacitor 26 is represented by K, a residual energy occurrence ratio $(V3'/V3)^2$ is represented by P, and a capacitance ratio C6/C3 is represented by 60, the following equations hold:

$$K=2/(1+\alpha)$$

$$P=((1-\alpha)/(1+\alpha))^2$$

For the voltage boost from C3 to C6, α can be selected in a range of 0<α<1. As α decreases, the residual energy increases though a large voltage boost ratio can be obtained. Conversely, as α increases, the residual energy decreases and the voltage boost ratio α decreases.

An input power ratio W for the capacitor 23 that is necessary to supply the same power to C6 is given by 1/(1−P), in which W is equal to 1 when α=1.

Table 1 shows values of the voltage boost ratio K, the residual energy ratio P, and the input power ratio W for respective values of α in a case of no circuit loss.

TABLE 1

| | | | | | | | |
|---|---|---|---|---|---|---|---|
| Capacitance ratio α | 0.125 | 0.250 | 0.500 | 0.625 | 0.750 | 0.875 | 1.000 |
| Voltage boost ratio K | 1.778 | 1.600 | 1.333 | 1.231 | 1.143 | 1.067 | 1.000 |
| Residual energy ratio P | 0.605 | 0.360 | 0.111 | 0.053 | 0.020 | 0.004 | 0.000 |
| Input power ratio W | 2.531 | 1.563 | 1.125 | 1.056 | 1.021 | 1.004 | 1.000 |

Figure 9:
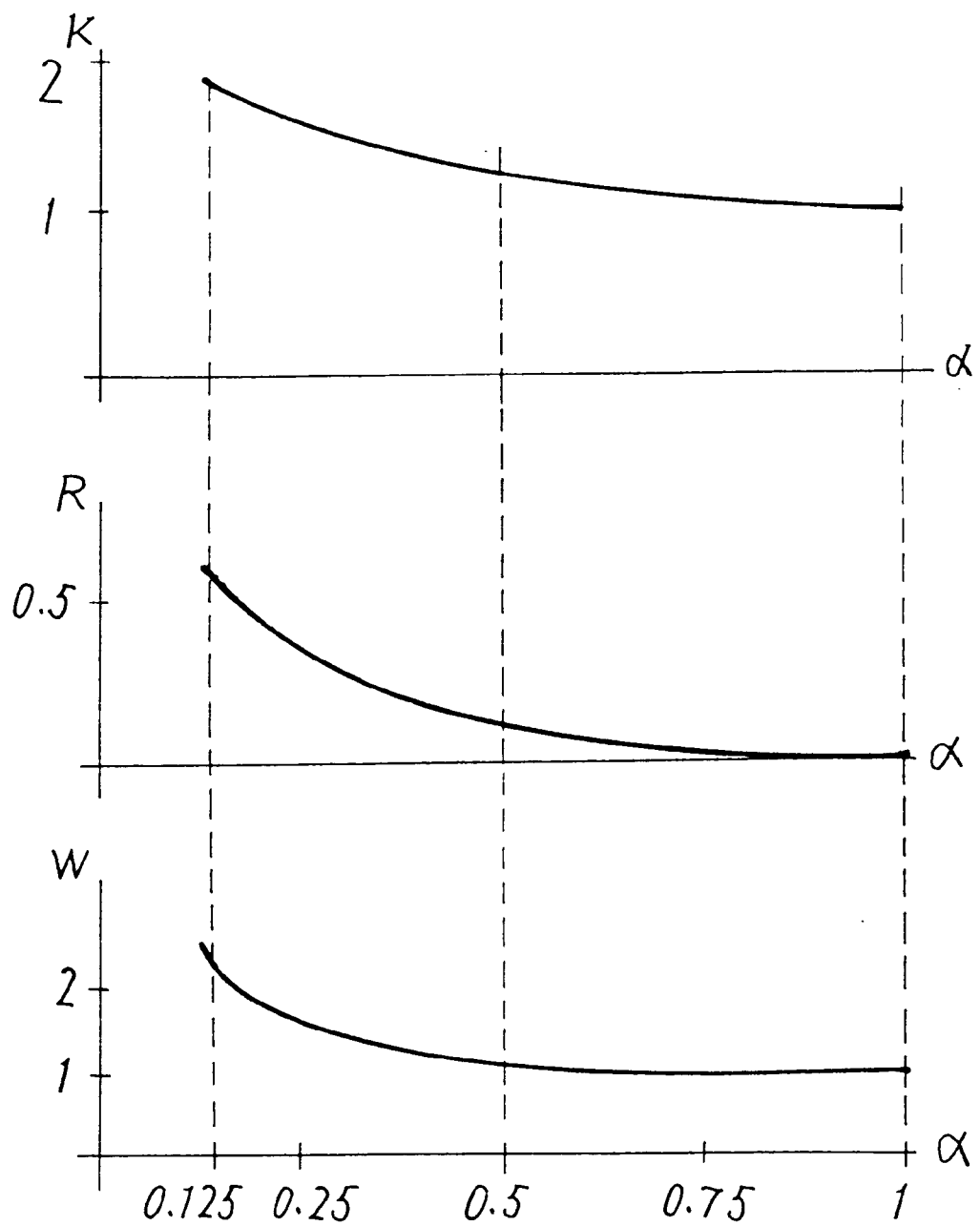
FIG. 9 is a graph showing a relationship between the capacitance ratio and the voltage boost ratio etc. for description of the circuit of FIG. 8.

FIG. 9 is a graphical representation of the above results.

The above results show that if the value of α is smaller than 0.25, the voltage boost ratio K can have a large value but the input power ratio steeply increases as α decreases. This causes great increases in the capacitance of the capacitor 23 and the current capacity of the switch 24. However, since most of power can be recollected, no useless power is required additionally.

If the voltage boost ratio K is evaluated by deducting an amount corresponding to actual circuit loss that amounts to several percent, it is understood that almost no voltage boosting effect is obtained if the value of α is larger than 0.75.

Therefore, a profound voltage boosting effect can be obtained without causing a large increase in circuit current or capacitance by setting the value of α in a range of 0.25–0.75, the upper limit being 0.625 when the circuit resistance can be designed at a low value (by a known technique such as thickening the windings of the reactors) or 0.875 when it cannot be done so.

It is apparent that according to the same principle the same is true of the voltage boost from the capacitor 6 to the capacitor 8.

According to the invention, since the ratio of the capacitance of a downstream capacitor to that of an upstream capacitor is set in the range of 0.25–0.75 in the case where the voltage of a generated pulse is increased further by using a pulse width compression circuit, a large voltage boost ratio can be obtained without the increasing, to a large extent, the capacitance values of capacitors and the magnitudes of currents that flow.

INDUSTRIAL APPLICABILITY

Although the pulsed power supply device of the invention has been described above for the case where a discharge tube as a pumping source of a laser is used as a load, the invention is not limited to such a case. For example, the pulse power supply device of the invention can also be applied to a driving source of a xenon lamp light emitting apparatus, an X-ray tube, or the like, and an inverter power supply device for generating a high voltage efficiently by using a low-voltage DC voltage source.

What is claimed is:

1. A pulsed power supply device comprising a DC voltage source and first and second series circuits connected to each other in series and provided between positive and negative output terminals of the DC voltage source, the first series circuit being a series circuit of a first reactor and a first forward-direction diode and the second series circuit being a series circuit of a second forward-direction diode and a switch, characterized in that:
   a third series circuit that is a series circuit of a capacitor, a second reactor, and a discharge tube is connected in parallel to the second series circuit.

2. The pulsed power supply device according to claim 1, characterized in that the second series circuit of the second forward-direction diode and the switch has a saturable reactor that is connected in series thereto.

3. The pulsed power supply device according to claim 2, characterized in that the second forward-direction diode has a resistor that is connected in parallel thereto.

4. A pulsed supply device comprising a DC voltage source and first and second series circuits connected to each other in series and provided between positive and negative output terminals of the DC voltage source, the first series circuit being a series circuit of a first reactor and a first forward-direction diode and the second series circuit being a series circuit of a second forward-direction diode and a switch, characterized in that:
   a third series circuit that is a series circuit of a capacitor, a second reactor, and a discharge tube is connected in parallel to the second series circuit;
   a connection order in each of the series circuits is so set that the first forward-direction diode, the second forward-direction diode, and the capacitor are connected to a connecting point of the first, second, and third circuits; and
   a three-terminal T-shaped circuit constituted of the first forward-direction diode, the second forward-direction diode, and the capacitor is configured in such a manner that a plurality of three-terminal T-shaped circuits each constituted of two diodes and a capacitor are connected to each other in parallel.

5. A pulsed supply device comprising a DC voltage source and first and second series circuits connected to each other in series and provided between positive and negative output terminals of the DC voltage source, the first series circuit being a series circuit of a first reactor and a first forward-direction diode and the second series circuit being a series circuit of a second forward-direction diode and a switch, characterized in that:
   a third series circuit that is a series circuit of a capacitor, a second reactor, and a discharge tube is connected in parallel to the second series circuit; and
   the second series circuit of the second forward-direction diode and the switch is configured in such a manner that plural sets of a diode and a semiconductor switch device that are connected to each other in series are connected to each other in series.

6. The pulsed power supply device according to claim 5, characterized in that each of the sets, constituting the second series circuit, of the second forward-direction diode and the semiconductor device that are connected to each other in series has surge voltage inhibiting means that is a series connection of a capacitor and a resistor and is connected in parallel to the set.

7. A pulsed power supply device comprising a DC voltage source and first and second series circuits connected to each other in series and provided between positive and negative output terminals of the DC voltage source, the first series circuit being a series circuit of a first reactor and a first forward-direction diode and the second series circuit being a series circuit of a second forward-direction diode and a switch, characterized in:
   that the pulsed power supply device comprises a series circuit of a first saturable reactor, a first capacitor, and a second capacitor, the series circuit being connected in parallel to the second series circuit;
   that the pulsed power supply device further comprises a pulse compression circuit that has a second saturable reactor and a third capacitor and is connected in parallel to the second capacitor; and that the pulsed power supply device comprises a discharge tube that is connected in parallel to the third capacitor of the pulse compression circuit.

8. The pulsed power supply device according to claim 7, characterized in that a ratio of a capacitance of the second capacitor to that of the first capacitor or a ratio of a capacitance the third capacitor to that of the second capacitor is set in a range of 0.25 to 0.75.

* * * * *